(12) United States Patent
Wang

(10) Patent No.: US 10,725,358 B2
(45) Date of Patent: Jul. 28, 2020

(54) TRANSPARENT DISPLAY DEVICE

(71) Applicants: BOE Technology Group Co., Ltd., Beijing (CN); Hefei BOE Optoelectronics Technology Co., Ltd., Hefei (CN)

(72) Inventor: Chuanyan Wang, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 15/183,276

(22) Filed: Jun. 15, 2016

(65) Prior Publication Data

US 2017/0090266 A1    Mar. 30, 2017

(30) Foreign Application Priority Data

Sep. 29, 2015 (CN) .......................... 2015 1 0634824

(51) Int. Cl.
*G02F 1/19* (2019.01)
*G02F 1/1335* (2006.01)
(Continued)

(52) U.S. Cl.
CPC .............. *G02F 1/19* (2013.01); *G02F 1/1336* (2013.01); *G02F 1/133555* (2013.01);
(Continued)

(58) Field of Classification Search
CPC .............. G02F 1/133555; G02F 1/1336; G02F 2001/133342; G02F 2202/22; G02F 2203/09; G02F 2001/133562; H01L 27/0296; H01L 51/0034; H01L 51/5253; H01L 51/5259; H01L 51/5271; H01L 2251/301; H01L 2251/5323; H01L 2251/5392; H01L 2251/558
See application file for complete search history.

(56) References Cited

U.S. PATENT DOCUMENTS 7,573,540 B2 *   8/2009  Katsuda ............ G02F 1/133308
                                                        349/58
7,820,252 B2 *  10/2010  Higashi ............. G02F 1/133555
                                                        349/114
(Continued)

FOREIGN PATENT DOCUMENTS

CN    201097043 Y    8/2008
CN    101615370 A   12/2009
(Continued)

OTHER PUBLICATIONS

Mar. 20, 2017—(CN) First Office Action Appn 201510634824.9 with English Tran.
(Continued)

*Primary Examiner* — Nathanael R Briggs
(74) *Attorney, Agent, or Firm* — Banner & Witcoff, Ltd.

(57) ABSTRACT

A transparent display device is provided. The transparent display device includes a transparent display panel and a layer being disposed on any display surface of the transparent display panel and having both of the transmission function and the reflection function. The layer covers the display surface of the entire transparent display panel.

19 Claims, 2 Drawing Sheets

(51) Int. Cl.
  *G02F 1/13357* (2006.01)
  *H01L 51/00* (2006.01)
  *H01L 51/52* (2006.01)
  *G02F 1/1333* (2006.01)
  *H01L 27/02* (2006.01)

(52) U.S. Cl.
  CPC ...... *H01L 27/0296* (2013.01); *H01L 51/0034* (2013.01); *H01L 51/5253* (2013.01); *H01L 51/5259* (2013.01); *H01L 51/5271* (2013.01); *G02F 2001/133342* (2013.01); *G02F 2202/22* (2013.01); *G02F 2203/09* (2013.01); *H01L 2251/301* (2013.01); *H01L 2251/5307* (2013.01); *H01L 2251/5323* (2013.01); *H01L 2251/5361* (2013.01); *H01L 2251/5392* (2013.01); *H01L 2251/558* (2013.01)

(56) References Cited

U.S. PATENT DOCUMENTS

| | | | | |
|---|---|---|---|---|
| 2010/0182552 | A1* | 7/2010 | Park | H01L 51/5281 349/114 |
| 2012/0008205 | A1* | 1/2012 | Perkins | G02B 5/3058 359/485.05 |
| 2012/0140304 | A1* | 6/2012 | Kuhlman | G02F 1/1347 359/228 |
| 2017/0045737 | A1* | 2/2017 | Cammenga | G02B 27/0101 |

FOREIGN PATENT DOCUMENTS

| | | | | |
|---|---|---|---|---|
| CN | 102096237 | A | | 6/2011 |
| CN | 102831837 | A | | 12/2012 |
| CN | 103345016 | A * | 10/2013 | ........... G02B 6/0065 |
| CN | 103943033 | A * | 7/2014 | ....... G02F 1/133555 |
| EP | 2666390 | A1 | | 11/2013 |

OTHER PUBLICATIONS

Jul. 17, 2017—(CN) Second Office Action Appn 201510634824.9 with English Tran.

* cited by examiner

TRANSPARENT DISPLAY DEVICE

This application claims priority to and the benefit of Chinese Patent Application No. 201510634824.9 filed on Sep. 29, 2015, which application is incorporated herein in its entirety.

TECHNICAL FILED

Embodiments of the present disclosure relate to a transparent display device.

BACKGROUND

The thin-film transistor (TFT) technology begins to grow rapidly in the nineties of the 20th century. In less than 10 years, thin-film transistor liquid crystal display (TFT-LCD) has grown rapidly to be a mainstream of display device. Semiconductor fully integrated circuit manufacturing technology in large scale, which adopts new materials and new processes, is the basis of liquid crystal (LC), inorganic and organic thin film electroluminescent (EL and OEL) flat-panel display devices. In recent years, the transparent display technology has become one hot research direction and can be widely applied in various fields due to the diversified characteristics thereof. In the past few years, Batch production is possible for transparent display devices. But those transparent display devices can only be taken as glass or display devices both sides of which can be viewed normally, so the function is single.

SUMMARY

Embodiments of the present disclosure provide a transparent display device.

Embodiments of the present disclosure provide a transparent display device, which includes a transparent display panel and a layer disposed on any display surface of the transparent display panel, the layer having both the transmission function and the reflection function. The layer covers the display surface of the entire transparent display panel.

In an example, the layer has a thickness of 10-500 nm.
In an example, the layer has a ratio of transmittance to reflectance of 1:4 to 4:1.
In an example, the ratio of the transmittance to the reflectance of the layer is 1:1.
In an example, the layer is made from metallic material.
In an example, the layer is made from silver or aluminum.
In an example, the transparent display panel is an organic light-emitting diode (OLED) device, which includes an anode layer, an organic layer, a conducting layer, an emission layer and a cathode layer sequentially arranged on a base substrate.
In an example, a moisture absorption layer, an isolating layer and a cover are sequentially arranged on the cathode layer; and the layer is as the isolating layer.
In an example, the moisture absorption layer is made from polymethyl methacrylate (PMMA).
In an example, an electrostatic discharge layer is disposed on a side of the base substrate of the OLED device away from the anode layer; and the layer is as the electrostatic discharge layer.
In an example, the transparent display panel is a liquid crystal display (LCD) panel, which includes an array substrate and an opposite substrate arranged oppositely, and a liquid crystal layer disposed between the array substrate and the opposite substrate.
In an example, an electrostatic discharge layer is disposed on a side of the array substrate away from the opposite substrate or on a side of the opposite substrate away from the array substrate; and the layer is as the electrostatic discharge layer.
In an example, the device further including a light-emitting unit disposed in non-display areas of two display surfaces or any display surface of the transparent display panel.
In an example, the light-emitting unit is a light-emitting diode (LED) lamp.

BRIEF DESCRIPTION OF DRAWINGS

Embodiments of the present disclosure will be described in more detail as below in conjunction with the accompanying drawings to enable those skilled in the art to understand the present disclosure more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "the," or the like, are not intended to limit the amount, but for indicating the existence of at lease one. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
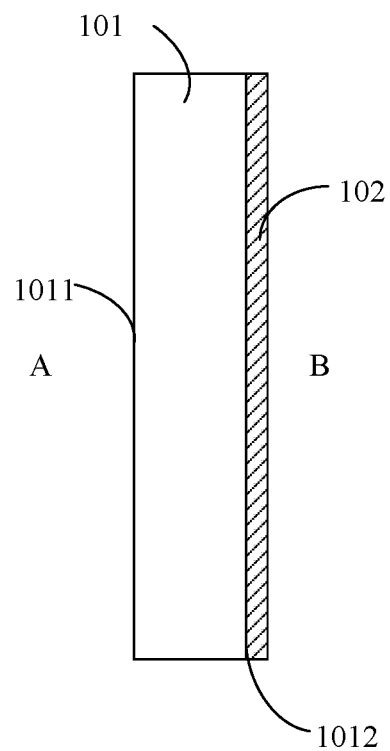
FIG. 1 is a schematic diagram of a transparent display device provided by an embodiment of the present disclosure.

As illustrated in FIG. 1, an embodiment of the present disclosure provides a transparent display device, which includes a transparent display panel 101 and a layer 102 disposed on any display surface of the transparent display panel 101. The layer 102 has both the transmission function and the reflection function. The layer 102 covers the entire display surface of the transparent display panel 101.

As illustrated in FIG. 1 which is a schematic diagram of a transparent display device provided by the embodiment of the present disclosure, the transparent display device includes a transparent display panel 101. The transparent display panel 101 includes two display surfaces, namely a first display surface 1011 and a second display surface 1012. In addition, in the embodiment of the present disclosure, a layer 102 which allows the transparent display device to have the function of unidirectional glass is also arranged in the transparent display device. The layer 102 may be disposed on any display surface 1011 or 1012 of the transparent display panel 101. FIG. 1 supposes that the layer 102 is disposed on the display surface 1012 as an example. The layer 102 has both transmission function and reflection function. The layer 102 covers the entire display surface 1012, so that the transparent display device has the function that one side is transparent glass and the other side is a mirror (namely unidirectional glass).

In the embodiment of the present disclosure, as the layer 102 having both the transmission function and the reflection function is additionally arranged in the transparent display device, when the brightness of the external environment is varied so that the brightness on both sides of the transparent display device satisfies some conditions, the transparent display device has the function that both sides are display devices in the "on" state and both sides are transparent glass in the "off" state, and it has the function that one side is a display device and the other side is a mirror in the "on" state, and one side is transparent glass and the other side is a mirror in the "off" state. Thus, the functions of the transparent display device are multiplied.

In the transparent display device provided by embodiments of the present disclosure, the brightness difference between two sides of the transparent display device can be changed due to the change of the brightness of the external environment, and it can be adjusted by additionally arranged a light-emitting unit (detailed description will be given below to the light-emitting unit). The embodiments of the present disclosure can independently control whether the transparent display device can normally display content (e.g., by controlling the on and off of the transparent display panel 101) and independently control the on or off of the light-emitting unit(s). Description will be given below by taking the capability of controlling the on and off of the display panel 101 as an example.

As illustrated in FIG. 1 again, the transparent display device provided by the embodiment of the present disclosure includes a transparent display panel 101 which includes two display surfaces (namely a first display surface 1011 and a second display surface 1012), and a layer 102 disposed on the second display surface 1012. In an instance the brightness of the external environment is varied so that the brightness on two sides of the transparent display device satisfies some conditions, the transparent display device has the function that both sides are display devices in the "on" state and both sides are transparent glass in the "off" state, and it has the function that one side is a display device and the other side is a mirror in the "on" state and one side is transparent glass and the other side is a mirror in the "off" state. Detailed description will be given below to the on and off conditions of the display panel 101 by further taking FIG. 1 as an example.

The display panel 101 is switched off.

When the display panel 101 is switched off, if the brightness difference between the A side and the B side of the transparent display device is not large (e.g., not greater than a predetermined first brightness threshold), the transparent display device is transparent glass not matter viewed from the A side or the B side; if the brightness difference between the A side and the B side of the transparent display device is very large (e.g., greater than the predetermined first brightness threshold), in an instance that the brightness of the A side is greater than that of the B side, the transparent display device is a mirror when viewed from the A side and is transparent glass when viewed from the B side; and in an instance that the brightness of the A side is less than that of the B side, the transparent display device is transparent glass when viewed from the A side and is a mirror when viewed from the B side. That is to say, when the display panel 101 is switched off, the transparent display device is a mirror when viewed from one side with higher brightness and is transparent glass when viewed from one side with lower brightness.

The display panel 101 is switched on.

When the display panel 101 is switched on, if the brightness difference between the A side and the B side of the transparent display device is not large (e.g., not greater than a predetermined second brightness threshold), the transparent display device is a transparent display device not matter viewed from the A side or the B side; if the brightness difference between the A side and the B side of the transparent display device is very large (e.g., greater than the predetermined second brightness threshold), when the brightness of the A side is greater than that of the B side, the transparent display device is a mirror when viewed from the A side and is a transparent display device when viewed from the B side; and when the brightness of the A side is less than that of the B side, the transparent display device is a transparent display device when viewed from the A side and is a mirror when viewed from the B side. That is to say, when the display panel 101 is switched on, the transparent display device is a mirror when viewed from one side with higher brightness and is a transparent display device when viewed from one side with lower brightness.

As the display panel has certain brightness when the display panel 101 is switched on, the required ambient brightness shall be very large, so that brightness difference can be formed between the A and B sides of the transparent display device. For instance, a light-emitting unit may be adopted to adjust the brightness difference between the A and B sides. The first brightness threshold and the second brightness threshold may be equal and may also be unequal.

Detailed description will be given below to the related characteristics of the layer 102 in the embodiments of the present disclosure.

During the implementation, when the thickness of the layer 102 is varied, the transmittance and the reflectance of the layer 102 will change. For instance, the thickness of the layer 102 may be about 10 nm to about 500 nm.

In the embodiments of the present disclosure, the layer 102 may be formed by vacuum coating or magnetron sputtering coating. Depending on the variation of the thickness, appropriate thickness of the layer 102 may be selected to allow the transmittance and the reflectance of the layer being balanced, so that the transparent display device can have the function that one side is transparent glass and the other side is a mirror (namely unidirectional glass) or have the function that one side is a display device and the other side is a mirror.

Appropriate layer 102 is selected so that the transmittance and the reflectance of the layer can be balanced. For instance, the ratio of the transmittance to the reflectance of the layer 102 is about 1:4 to about 4:1.

That is to say, the ratio of the transmittance to the reflectance is ranged from about 1:4 to about 4:1, namely the transmittance and the reflectance are about 20% to about 80%. For instance, the thickness of the layer 102 may be selected so that the transmittance is about 60% and the reflectance is about 40%. But the embodiments of the present disclosure are not limited thereto. The transmittance and the reflectance may also be other values between about 20% to about 80% to allow the ratio of them being about 1:4 to about 4:1.

For instance, the ratio of the transmittance to the reflectance of the layer 102 is about 1:1. That is to say, when the transmittance is equal to the reflectance, the function of the transparent display device that one side is transparent glass and the other side is a mirror or one side is a display device and the other side is a mirror is more apparent.

The layer 102 may be made from any material which can allow the transparent display device to have the function that one side is transparent glass and the other side is a mirror (namely unidirectional glass) or one side is a display device and the other side is a mirror. For instance, the layer 102 is made from metallic material. For instance, the material of the layer 102 is silver or aluminum, but the embodiments of the present disclosure are not limited thereto.

The display panel 101 of the transparent display device provided by the embodiments of the present disclosure may be an OLED device or an LCD panel. Detailed description will be given below to the function and the position of the layer 102 in instances that the display panel 101 is selected from the two types of panels, respectively.

Example 1: The Display Panel 101 is an OLED Device

Figure 2:
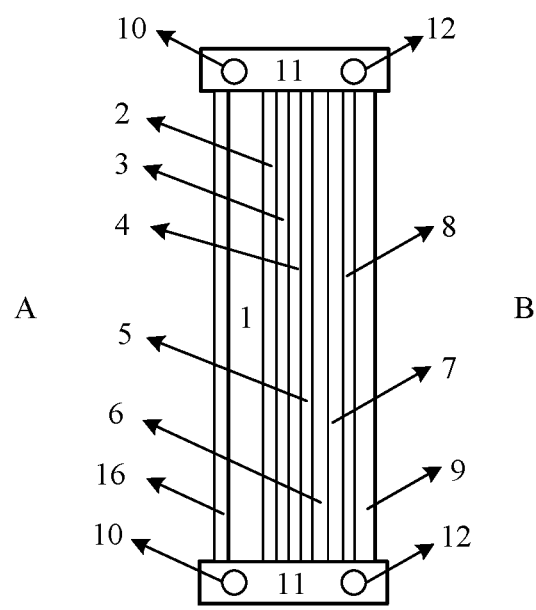
FIG. 2 is a schematic diagram of a transparent display device provided by an embodiment of the present disclosure, in which the display panel is an OLED device.

FIG. 2 is a schematic diagram of a transparent display device provided by an embodiment of the present disclosure, in which the display panel 101 is an OLED device. For instance, the transparent display panel 101 is an OLED device, which includes an anode layer 2, an organic layer 3, a conducting layer 4, an emission layer 5 and a cathode layer 6 sequentially arranged on a base substrate 1. A moisture absorption layer 7, an isolating layer 8 and a cover plate 9 are sequentially arranged on the cathode layer. The layer 102 is as the isolating layer 8. The material of the moisture absorption layer 7 is organic glass, namely polymethyl methacrylate (PMMA).

The moisture absorption layer 7 can absorb oxygen or moisture in functional layers of components; the isolating layer 8 can isolate external moisture and oxygen; and the cover plate 9 may select material according to moisture absorption materials and isolating materials, and thus, it is an optional component.

In the embodiment of the present disclosure, the moisture layer 7 is made from PMMA; the layer 102 use multiplexedly the isolating layer 8 (namely the layer 102 can be formed by the vacuum depositing or sputtering a metal on the moisture absorption layer made from the PMMA). The moisture absorption layer 7 made from the PMMA and the layer 102 (namely the isolating layer 8) made from the metal have no pattern and are entirely cover or applied on the display panel 101. The layer 102 made from the metallic material may also be configured to isolate external moisture and oxygen. The moisture absorption layer 7 made from the organic glass PMMA can absorb moisture, and it has the insulating function and isolates the cathode layer 6 and the isolating layer 8 so as to avoid the conduction between them.

In an embodiment of the present disclosure, in a process of forming the moisture absorption layer 7 made from the PMMA, the PMMA may be dissolved in a polar solvent and transferred onto the entire panel by a roll, and subsequently, the solvent is heated and volatilized to form the moisture absorption layer made from the PMMA. The moisture absorption layer 7 and the isolating layer 8 can avoid the components from being affected by moisture or oxygen and hence shortening the service life. That is to say, the layer 102 made from the metallic material has the function of the isolating layer (isolating the moisture and oxygen in the air), and it can act as a mirror, so that the transparent display device can have the function that one side is transparent glass and the other side is a mirror, or one side is a display device and the other side is a mirror.

Except that the layer 102 is used multiplexedly as the isolating layer 8, the layer 102 may also be used multiplexedly as an electrostatic discharge layer 16 on the premise of not changing the moisture absorption layer 7 and the isolating layer 8, so that the transparent display device can have the function that one side is transparent glass and the other side is a mirror, or one side is a display device and the other side is a mirror.

For instance, the proposal of multiplexing the layer 102 as an electrostatic discharge layer 16 is the same as the structure of the above proposal. The transparent display device provided by the embodiment of the present disclosure as shown in FIG. 2, in which the display panel 101 is an OLED device, is taken as an example. For instance, the electrostatic discharge layer 16 is disposed on one side of the base substrate 1 of the OLED device away from the anode layer 2. The layer 102 is taken as the electrostatic discharge layer 16.

In the embodiment of the present disclosure, in an instance that the transparent display panel 101 is an OLED device, the layer 102 is used multiplexedly as an electrostatic discharge layer 16. That is to say, the electrostatic discharge layer is a layer 102 made from metallic material (e.g., silver or aluminum) instead of a transparent indium tin oxide (ITO) layer. Originally, the electrostatic discharge layer may be formed by attaching a protective film to the OLED device and adding a viewing angle film, and act as an electrostatic discharge layer in subsequent processes. But in the embodiment of the present disclosure, after the electrostatic discharge layer usees the layer 102 made from the metallic material, the electrostatic discharge layer can act as an electrostatic discharge layer, and it can allow the transparent display device to have the function that one side is a display device and the other side is a mirror when the display panel is switched on, and one side is transparent glass and the other side is a mirror when the display panel is switched off. In the embodiment, the moisture absorption layer or the isolating layer of the OLED device may be made from any transparent material. For instance, the moisture absorption layer may be made from silicone rubber, thin and transparent polyvinyl alcohol (PVA) resin, or the like; and the isolating layer may be made from glass or engineering plastics, namely transparent materials, such as acrylonitrile-butadiene-styrene (ABS).

Description will be given below to the function and the position of the layer 102 in an instance that the display panel 101 is an LCD panel.

Example 2: The Display Panel 101 is an LCD Panel

Figure 3:
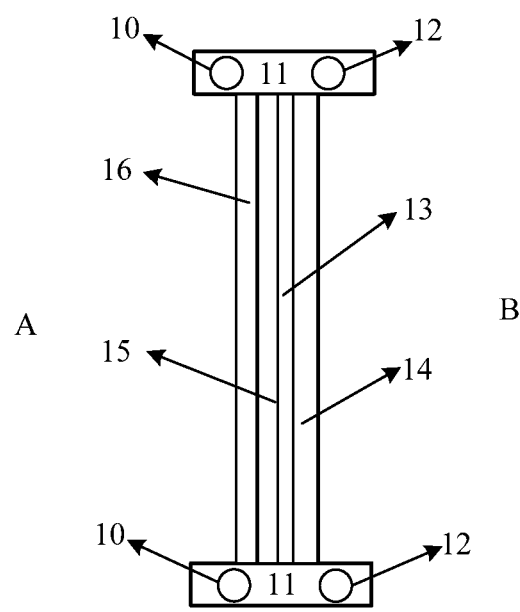
FIG. 3 is a schematic diagram of a transparent display device provided by an embodiment of the present disclosure, in which the display panel is an LCD panel.

FIG. 3 is a schematic diagram of a transparent display device provided by the embodiment of the present disclosure, in which the display panel 101 is an LCD panel. For instance, the transparent display panel 101 is an LCD panel, which includes an array substrate 15 and an opposite substrate 14 arranged oppositely, and a liquid crystal layer 13 disposed between the array substrate 15 and the opposite substrate 14. An electrostatic discharge layer 16 is disposed on a side of the array substrate 15 away from the opposite substrate 14 (namely on the array substrate 15) or a side of the opposite substrate 14 away from the array substrate 15 (namely on the opposite substrate 14). The layer 102 can be as the electrostatic discharge layer 16.

For instance, the LCD panel includes an array substrate 15 and an opposite substrate 14 arranged oppositely, a liquid crystal layer 13 disposed between the array substrate 15 and the opposite substrate 14, and an electrostatic discharge layer 16 disposed on the A side (namely on the array substrate 15) or the B side (namely on the opposite substrate 14) of the LCD panel.

As illustrated in FIG. 3, a conducting layer (ITO) (namely an electrostatic discharge layer 16) is disposed on the A side of the array substrate 15 and configured to eliminate static electricity produced by the subsequent polarizer attachment process or other processes. In the embodiment of the present disclosure, the layer 102 made from metallic material is used multiplexedly as the electrostatic discharge layer 16 (namely the ITO layer), which can eliminate static electricity, namely the layer 102 made from the metallic material can have the function of electrostatic discharge when attaching a protective film to the OLED device, adding a viewing angle film or performing subsequent processes, and it can allow the transparent display device to have the function that one side is a display device and the other side is a mirror when the display panel is switched on, and that one side is transparent glass and the other side is a mirror when the display panel is switched off. For instance, the electrostatic discharge layer 16 may also be formed on an external surface of a substrate on the B side of the LCD transparent display device.

As the brightness of the external environment may change at any time, and cannot be well controlled, it is difficult to freely adjust the brightness difference between two sides of a transparent display device. In order to conveniently and actively adjust the brightness difference on the two sides of the transparent display device, a light-emitting unit for adjusting the brightness may also be additionally arranged in the present disclosure.

For instance, the transparent display device further includes a light-emitting unit disposed in non-display areas of two display surfaces or any display surface of the transparent display panel 101. For instance, the light-emitting unit is an LED lamp.

The additionally arranged light-emitting unit(s) may artificially or actively control of the brightness of the two sides of the transparent display device. The brightness difference between the two sides of the transparent display device can be more significant by controlling the switching of the on/off of the light-emitting unit(s), so that the transparent display device can be converted actively into a transparent display device that one side is a display device and the other side is a mirror, or one side is transparent glass and the other side is a mirror. The light-emitting unit may be any light-emitting device capable of adjusting the brightness difference between two sides of the transparent display device. For instance, the light-emitting unit may be a light emitting diode (LED) lamp. In the embodiments of the present disclosure, the number of the light-emitting unit may be one or more and is/are disposed in non-display areas of two display surfaces or any display surface of the display panel 101.

As illustrated in FIGS. 2 and 3, the number of the light-emitting units is 4, and two first light-emitting units 10 and two second light-emitting units 12 are respectively disposed on the upper side and the lower side of the non-display area of the display panel 101. For instance, the first light-emitting units 10 and the second light-emitting units 12 may be disposed in a frame 11 of the transparent display device. But the embodiments of the present disclosure are not limited thereto. For instance, in some embodiments, the frame 11 may not be provided. For instance, although LED lamps are distributed on the upper side and the lower side as shown in FIGS. 2 and 3, the light-emitting unit may also be only disposed in the non-display area of one display surface of the display panel 101, for instance, it is only disposed on the upper side and/or the lower side of the A side or the B side; or it may be arranged on the left and/or the right of the non-display area of the display panel 101; or it may be arranged on all of the four sides. But the embodiments of the present disclosure are not limited thereto. For instance, the light-emitting units may also be distributed on the circumference of one or two display surfaces of the display panel 101.

The embodiments of the present disclosure may achieve double or multiple functions of the transparent display device and the unidirectional glass. That is to say, when the display panel 101 is switched off, the transparent display device may be as glass and any side may also be as a mirror; and when the display panel 101 is switched on, both sides can be viewed, or one side can be viewed and one side is taken as a mirror. Thus, the multiple functions of the display panel 101 can be achieved.

The embodiment of the present disclosure provides a transparent display device, which includes a transparent display panel and a layer being disposed on any display surface of the transparent display panel and having both the transmission function and the reflection function. The layer covers the entire display surface of the transparent display panel. Due to the addition of the layer having both the transmission function and the reflection function, when the transparent display panel in the transparent display device is switched on, if the brightness of the external environment is varied so that the brightness on two sides of the transparent display device is balanced or equivalent, both sides are display devices; if the brightness difference between two sides is very large, one side with lower brightness is a display device and one side with higher brightness is a mirror. When the transparent display panel is switched off, if the brightness of the external environment is varied so that the brightness on two sides of the transparent display device is balanced or equivalent, both sides are transparent glass; if the brightness difference between two sides is very large, one side with lower brightness is transparent glass and one side with higher brightness is a mirror. Thus, the functions of the transparent display device can be increased. That is to say, due to the addition of the layer having both the transmission function and the reflection function, when the brightness of the external environment is varied so that the brightness on two sides of the transparent display device satisfies some conditions, the transparent display device has the function that both sides are display devices in the "on" state and are transparent glass in the "off" state, and it has the function that one side is a display device and the other side is a mirror in the "on" state, and one side is transparent glass and the other side is a mirror in the "off" state. Thus, the functions of the transparent display device can be increased.

The described above are only illustrative implementations of the present disclosure, and the present disclosure is not intended to limited thereto. For a person of ordinary skill in the art, various modifications and improvements can be made without departing from the spirit and scope of the present disclosure, and all of which shall fall within the protection scope of the present invention.

The present application claims the priority of Chinese patent application No. 201510634824.9 filed on Sep. 29, 2015 and entitled "Transparent Display Device," which is incorporated herein by reference entirely.

What is claimed is:

1. A transparent display device, comprising a transparent display panel and a layer disposed on a display surface of the transparent display panel, wherein the layer has both a transmission function and a reflection function and covers an entirety of the display surface of the transparent display panel, the layer is an isolating layer configured to allow the transparent display device to be a mirror when viewed from a first side with a higher brightness and to be transparent glass when viewed from a second side with a lower brightness and opposite to the first side when the transparent display panel is switched off and a brightness difference between the first side and the second side is controlled by a light-emitting unit disposed in non-display areas of two opposite display surfaces to be greater than a predetermined first brightness threshold; and wherein the transparent display panel is an organic light-emitting diode (OLED) device including an anode layer, an organic layer, a conducting layer, an emission layer, and a cathode layer sequentially arranged on a base substrate, and wherein a moisture absorption layer, the layer, and a cover plate are sequentially arranged on the cathode layer to form a tri-layer sealing structure.

2. The transparent display device according to claim 1, wherein the layer has a thickness of 10-500 nm.

3. The transparent display device according to claim 1, wherein the layer has a ratio of transmittance to reflectance of 1:4 to 4:1.

4. The transparent display device according to claim 3, wherein the ratio of the transmittance to the reflectance of the layer is 1:1.

5. The transparent display device according to claim 1, wherein the moisture absorption layer is made from polymethyl methacrylate (PMMA).

6. The transparent display device according to claim 1, wherein an electrostatic discharge layer is disposed on a side of the base substrate of the OLED device away from the anode layer.

7. The transparent display device according to claim 1, wherein the light-emitting unit is a light-emitting diode (LED) lamp.

8. The transparent display device according to claim 2, further comprising a light-emitting unit disposed in non-display areas of two display surfaces or any display surface of the transparent display panel.

9. The transparent display device according to claim 2, further comprising: a light-emitting unit disposed in non-display areas of two display surfaces or any display surface of the transparent display panel.

10. The transparent display device according to claim 3, further comprising a light-emitting unit disposed in non-display areas of two display surfaces or any display surface of the transparent display panel.

11. The transparent display device according to claim 5, further comprising: a light-emitting unit disposed in non-display areas of two display surfaces or any display surface of the transparent display panel.

12. The transparent display device according to claim 1, wherein the layer is an ITO layer.

13. A transparent display device, comprising a transparent display panel and a layer disposed on a display surface of the transparent display panel, wherein the layer has both a transmission function and a reflection function and covers an entirety of the display surface of the transparent display panel, the layer is an isolating layer configured to allow the transparent display device to be a mirror when viewed from a first side with a higher brightness and to be transparent when viewed from a second side with a lower brightness and opposite to the first side when the transparent display panel is switched on and a brightness difference between the first side and the second side is controlled by a light-emitting unit disposed in non-display areas of two opposite display surfaces to be greater than a predetermined second brightness threshold; and wherein the transparent display panel is an organic light-emitting diode (OLED) device including an anode layer, an organic layer, a conducting layer, an emission layer, and a cathode layer sequentially arranged on a base substrate, and wherein a moisture absorption layer, the layer, and a cover plate are sequentially arranged on the cathode layer to form a tri-layer sealing structure.

14. The transparent display device according to claim 13, wherein the layer is an ITO layer.

15. The transparent display device according to claim 13, wherein the layer has a thickness of 10-500 nm.

16. The transparent display device according to claim 13, wherein the layer has a ratio of transmittance to reflectance of 1:4 to 4:1.

17. The transparent display device according to claim 16, wherein the ratio of the transmittance to the reflectance of the layer is 1:1.

18. The transparent display device according to claim 13, wherein an electrostatic discharge layer is disposed on a side of the base substrate of the OLED device away from the anode layer.

19. A transparent display device, comprising a transparent display panel and a layer disposed on a display surface of the transparent display panel, wherein the layer has both a transmission function and a reflection function and covers an entirety of the display surface of the transparent display panel, the layer is configured to allow the transparent display device to be a mirror when viewed from a first side with a higher brightness and to be transparent when viewed from a second side with a lower brightness and opposite to the first side when the transparent display panel is switched on and a brightness difference between the first side and the second side is controlled by a light-emitting unit disposed in non-display areas of two opposite display surfaces to be greater than a predetermined second brightness threshold;

wherein the transparent display panel is a liquid crystal display panel (LCD), the LCD including: an array substrate and an opposite substrate disposed opposite to each other, and a liquid crystal layer provided between the array substrate and the opposite substrate, wherein a material of the layer is a metal material, and the layer is provided on a side of the array substrate facing away from the opposite substrate or on a side of the opposite substrate facing away from the array substrate, and configured to be an electrostatic discharge layer.

* * * * *